United States Patent [19]
Petroff

[11] Patent Number: 5,192,709
[45] Date of Patent: Mar. 9, 1993

[54] NANOSCALE MODULATION DOPING METHOD

[75] Inventor: Pierre M. Petroff, Santa Barbara, Calif.

[73] Assignee: University of California Office of Technology Transfer, Alameda, Calif.

[21] Appl. No.: 761,308

[22] Filed: Sep. 17, 1991

[51] Int. Cl.$^5$ ................................. H01L 21/20
[52] U.S. Cl. ........................ 437/110; 437/129; 437/133
[58] Field of Search ............... 437/110, 129, 133

[56] References Cited

U.S. PATENT DOCUMENTS 4,980,313 12/1990 Takahashi ..................... 437/110
5,108,948 4/1992 Murakami et al. ............. 437/110

FOREIGN PATENT DOCUMENTS 309391 12/1989 Japan .
237190 9/1990 Japan .

Primary Examiner—Brian E. Hearn
Assistant Examiner—Linda J. Fleck
Attorney, Agent, or Firm—A. C. Smith

[57] ABSTRACT

A method for modulation doping of semiconductor heterostructures includes forming a semiconductor heterostructure comprising a substrate layer, a narrow band-gap quantum well layer, and a donor implantation layer. A focused ion beam writes across the surface of the donor implantation layer, at a maximum angle of incident less than that of the channeling half-angle $\alpha$ of the donor implantation layer. Channeled dopant ions penetrate deep within the donor implantation layer, far from surface damage sites, and away from the quantum well layer. The addition of a dechanneling layer within the donor implantation layer, and of a series of spacer layers, further localizes the implanted donor ions and separates these ions from the quantum well layer. Once activated by a thermal annealing process, the donor ions release carriers into the quantum well layer where carrier mobility is unimpeded by donor ion collisions. An alternative embodiment implants the donor ions before the heterostructure is completely formed. Another alternative embodiment deposits concentrations of dopant ions partially into the quantum layer, where the ions serve as point defects causing interdiffusion of the donor implantation layer material and that of the quantum well layer. Quantum well regions are formed, separated by interdiffusion regions containing donor ions.

24 Claims, 7 Drawing Sheets

NANOSCALE MODULATION DOPING METHOD

This invention was made with Government support under Contract No. AFOSR #88-0334, awarded by the U.S. Air Force. The Government has certain rights in this invention.

BACKGROUND OF THE INVENTION

The present invention relates to semiconductor processing systems and, more particularly, to using focused ion beam deposition in the fabrication of semiconductor devices.

Semiconductor devices employ layers and/or areas of differently-doped semiconductor materials. Dopants are impurities added to the material to change its electrical properties. Dopants generally provide donor ions that "donate" electrical carriers to the material. The carriers can be negatively charged electrons or positively charged holes. The dopant or donor ions are distributed within the material through which the carriers travel; the carriers scatter off donors within their travel direction, decreasing their mobility. Traditional devices built from doped semiconductor materials are usually limited in their speed of operation by the reduced carrier mobility.

Modulation doping is a relatively recent semiconductor technology intended to improve carrier mobility. Modulation doping physically separates in the device the donor ions from the carrier gas induced in the semiconductor materials. The carriers experience far less impurity scattering and their mobility is increased by as much as four to five orders of magnitude. Devices formed from modulation doped materials (such as field-effect transistors) operate far faster than conventional devices.

Current techniques for modulation doping introduce dopant atoms during growth in that part of the structure that will separate them from the carrier gas they induce. Normally the structure is grown using molecular beam epitaxy (MBE) or metal-organic chemical vapor deposition (MOCVD). Typically, one layer (for example, of AlGaAs) holds the donor atoms, while the two-dimensional electron gas (2DEG) is induced in an adjacent inversion layer (for example, of GaAs). Modulation doping has been applied for both electron and hole two-dimensional gases. In this case, the inversion layer created at the AlGaAs-GaAs interface will collect.

Unfortunately, current modulation doping techniques are not useful for fabricating complex, heterogeneous integrated devices. The nature of the MBE and MOCVD processes for growing the modulation doped layers render semiconductor wafers uniformly doped over their entire surface. Current technological and commercial uses require more sophisticated integrated circuits that would require differentially doped areas, either in size, shape or in relative concentration and nature of doping (p or n type). Conventional photolithographic techniques (such as masking off non-doped areas) are of little use, since both MBE and MOCVD require ultra-clean surfaces: any contamination from a masking step would ruin the final device.

The present methods for forming modulation doped structures do not provide a complete and flexible system for semiconductor fabrication. What is needed is an improved method for adding dopant ions selectively across a semiconductor surface. An improved modulation doping method should allow precise location of donor ions substantially away from active electrical regions where the highly mobile two-dimensional carrier gases are formed. The improved method ideally would provide techniques applicable to a wide range of semiconductor materials, electrical devices and fabrication geometries. The method should provide a simple and cost-effective technology for accurately adding dopant ions to any semiconductor substrate, for any purpose.

SUMMARY OF THE INVENTION

In accordance with the present invention, a nanoscale modulation doping method combines a focused ion beam deposition of dopant ions, along with methods for channeling and then selectively de-channeling dopant ions along semiconductor lattices. The methods of the present invention are useful for creating modulation doped devices. But the methods also find use in many other semiconductor applications where precision control of the depth and horizontal location of dopant ions is necessary.

The present invention uses a focused ion beam. The beam is oriented such that the angle of incidence of dopant ions as they strike the semiconductor surface falls within a channel formed by the semiconductor lattice. The incident "channeled" ions thereby travel a relatively long distance; after losing most of its kinetic energy from elastic collisions with the lattice, each incident ion comes to rest, displacing an atom from the semiconductor lattice. Conventional ion beam deposition avoids using channeling effects. Conventionally incident ions travel through the semiconductor material, scattering off of atoms in the lattice. The resulting paths through the material create a large spread of dopant ions at a projected ion range $R_p$. The present invention by using ion channeling avoids such ion beam broadening, and minimizes damage caused by multiple collisions with the lattice. Thus the benefits of a small ion beam provided by the focused ion beam (FIB) are preserved.

To accurately control where the deposited ions come to rest, the present invention also uses a dechanneling layer. The dechanneling layer is a thin layer composed of a different semiconductor material, having a different lattice separation constant than that of the main lattice. Incident ions traveling through a lattice channel, entering the short region having a different lattice constant, are thereby defocused and quickly strike and displace a lattice atom. By including this dechanneling layer (or "pseudo-morphic strain layer") in the semiconductor structure, depth of the deposited dopant ions can be located with much greater precision.

The combination of channeled ions with dechanneling layers allows fabrication of integrated modulation-doped devices, each having a different geometry. The precise focused ion beam allows the writing of variously shaped deposits of dopant ions. The channeling allows the ion beam to remain focused, even as it penetrates deep within the semiconductor lattice. The dechanneling layer (located in the end of the channeling range) provides precise control over the exact depth where the imbedded donor ions come to rest. Using the methods of the present invention, donor ions can be placed in discrete areas of the semiconductor wafer, and at accurate distances from the quantum well where the carrier gas is formed.

In one embodiment, a quantum well is first formed by sandwiching a low band-gap material between layers of wide band-gap materials. Then donor ions are added by channeling a focused ion beam, depositing the donors within the wide band-gap material, at a given distance from the well. Rapid thermal annealing (RTA) anneals out defects induced by ion implantation, and activates the deposited donors, creating a two-dimensional gas in the quantum well layer. In another embodiment, a donor implantation layer (formed of wide band-gap material) is first formed, in which donor atoms are deposited by the same techniques. Then a quantum well layer and another wide band-gap layer are formed over the first layer, to complete the device. RTA again anneals out defects from the lattice and activates the donor atoms. In each of these embodiments, a dechanneling layer may or may not be used depending upon the precision desired in placing the deposited ions. In addition, a short period superlattice compound of two different types of semiconductor materials can also be deposited to prevent further migration of donor ions toward the quantum well during the annealing process.

In another embodiment, a quantum well layer is formed, sandwiched between two wide band-gap layers. The focused ion beam and channeling methods deposit groups of dopant ions that also will introduce point defects. If the point defect concentration is large enough, the annealing used to activate the dopant will also promote a local enhancement of the interdiffusion. For instance, these dopant ions might be silicon deposited in an AlGaAs wide band-gap layer. These ions are allowed to penetrate the quantum well layer, which can be GaAs. During an interdiffusion process of rapid thermal annealing, the aluminum ions of the wide band-gap layer (at the point defect sites) migrate into the quantum well area. Depending on how the dopant ions are deposited, the quantum well layer can be broken into a series of quantum well islands, or into a quantum well sheet perforated by wide band-gap islands. Or, in another embodiment, the method can form quantum well rings.

Once the new topology of the quantum wells is constructed, the activated dopant ions provide a source of carriers to enter into the separated quantum well areas. Due to the lack of donor ions in the quantum well areas, and the consequently high carrier mobility, perpetual currents can be created. Variously shaped quantum well regions formed by the methods of the present invention provide novel devices having unique electrical properties.

The methods and apparatus of the present invention provide novel techniques for inscribing and fabricating nanoscale electrical devices, and integrating varieties of such devices, within semiconductor substrates. The methods of channeling ion implanted donors, and dechanneling such ions at precise layers in a semiconductor substrate allow the creation of efficient and fast modulation-doped components. The present invention allows practicable, commercially feasible fabrication of such devices. The channeling of ions and the addition of dechanneling layers provide techniques for a wide variety of semiconductor devices and applications. The present invention provides a flexible method for precisely controlling the deposited amount of donor ions, as well as how deep in the substrate and exactly where along the substrate the ions come to rest. These and other features and advantages of the present invention are apparent from the description below with reference to the following drawings.

Although the invention may use donor ions as a source of carriers (electrons) for the electron gas, the invention can also use acceptor ions as a source of carriers (holes) for the hole gas.

DESCRIPTION OF THE PREFERRED EMBODIMENTS

Figure 1C:
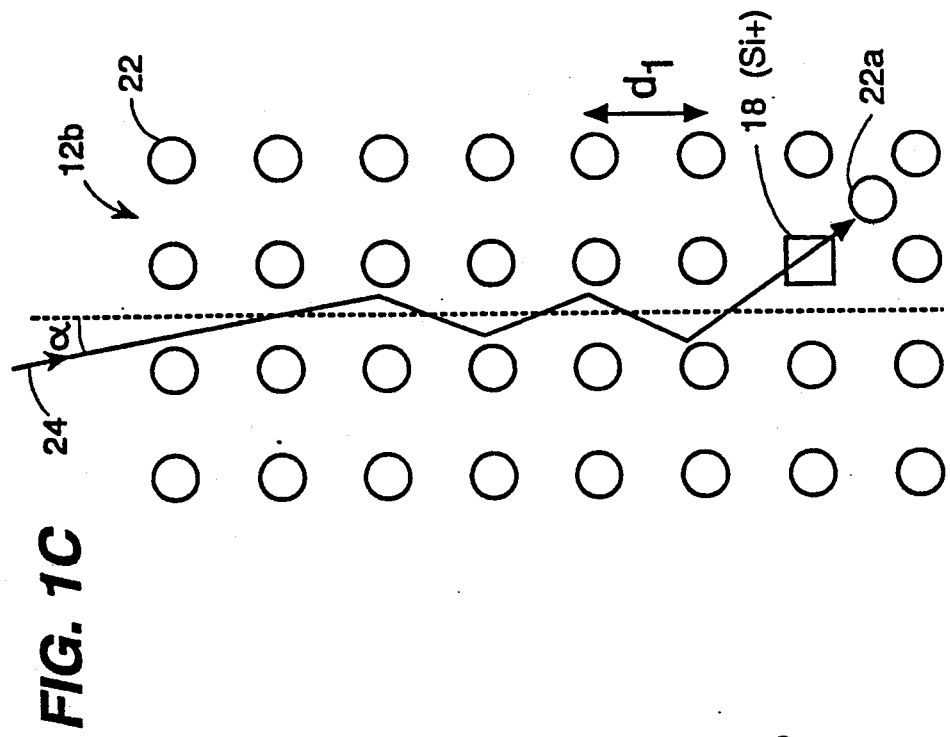
FIG. 1C shows a schematic diagram of a semiconductor lattice and the path of a channeled donor ion.
Figure 1A:
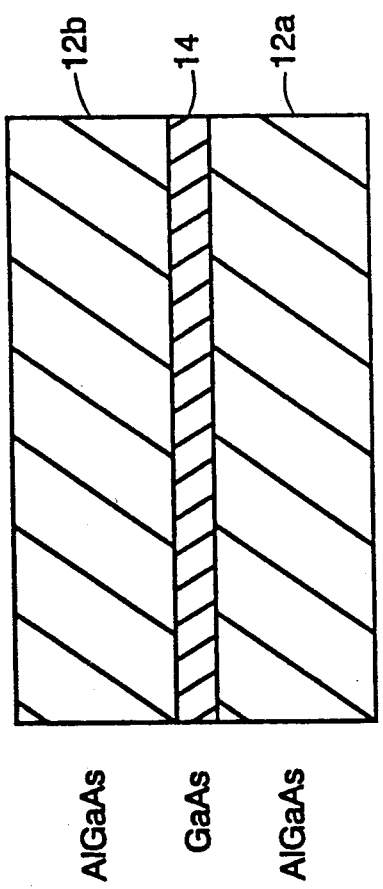
FIG. 1A shows a cutaway view of a semiconductor heterostructure having a quantum well layer.
Figure 1B:
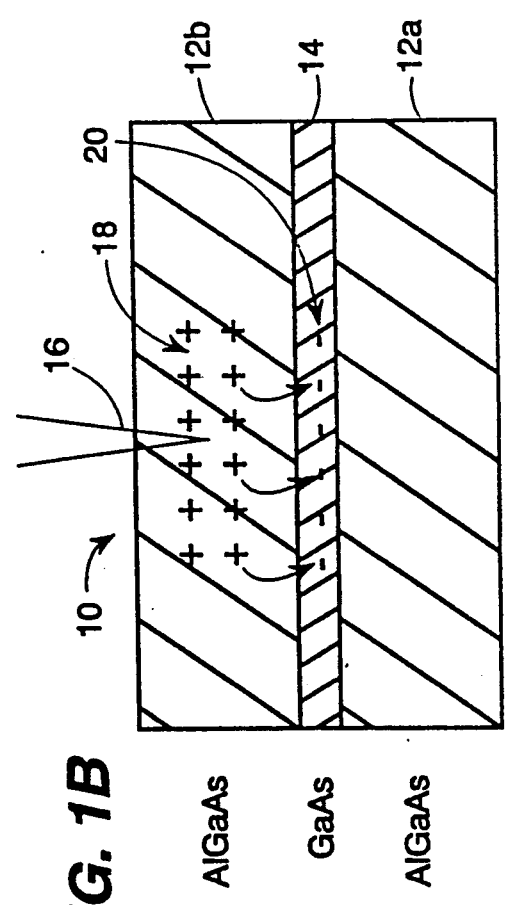
FIG. 1B shows a cutaway view of a semiconductor heterostructure with implanted donor ions in accordance with the present invention.

In accordance with the present invention, FIGS. 1A and 1B show fabrication steps forming nanoscale modulation doped devices. FIG. 1A shows a sandwich semiconductor heterostructure 10, comprising a first wide band-gap layer 12a of AlGaAs (which can also function as a substrate layer), a second thinner quantum well layer 14 of GaAs, and a second wide band-gap layer 12b of AlGaAs. The second layer 12b will receive the implanted donor ions and is thereby termed the donor implantation layer throughout this description. In the preferred embodiment, the concentrations of the AlGaAs layers are $Al_{0.3}Ga_{0.7}As$. The layers 12a and 12b are approximately 0.4 $\mu$m and 0.3 $\mu$m thick respectively, while the quantum well layer 14 is approximately 12 nm thick. The heterostructure 10 can be grown by molecular beam epitaxy. In the preferred embodiment, the growth temperature was 580° C. and the growth rate of the GaAs was 0.7 μm/h. While these concentrations, thicknesses, temperatures and growth rates were employed in the preferred embodiment, it should be clear that a wide variety of materials, thicknesses, layer arrangements and fabrication parameters can be used with the methods of the prevent invention.

FIG. 1B shows the same heterostructure substrate 10 being inscribed by a focused ion beam 16 over a portion of its upper surface. As ion beam 16 penetrates the upper donor implantation layer 12b, it deposits donor ions 18. Due to channeling effects, these donor ions penetrate deep within the layer 12b with relatively little damage to the semiconductor material. Present technology focused ion beams can inscribe circular areas as small as 400 Å in diameter. The ion beam probe can be scanned to create virtually any doping pattern shape including lines, squares or dots. In the preferred embodiment, the donor ions are silicon, but the choice of donor ion depends upon the materials chosen for the semiconductor heterostructure and the required electrical properties of the final devices. FIG. 1C shows a rough schematic diagram of the effects of channeling the focused ion beam. Donor implantation layer 12b is composed of lattice atoms 22. Dopant ions 24 enter the lattice at a small angle of incidence $\alpha$, such that the ions glance off the walls of a channel through the lattice represented by the dotted line. The channeling half-angle is given by:

$$\alpha = K\sqrt{\frac{Z_1 Z_2}{E d}} \quad (1)$$

where E is the incident ion energy in MeV, $Z_1$ is the incident ion's atomic number and $Z_2$ is that of the lattice atoms, d is the spacing (in Å) between atoms along the channel, and constant K is a function of the lattice atom's vibrational amplitude, ranging between 0.24 and 0.36. The focus angle of the ion beam, when less than or equal to the channeling half-angle $\alpha$, can inject ions into the channel.

Elastic collisions between the channeled ion 24 and the lattice atoms 22 transfer energy from the dopant ion slowing it down. Eventually, the slowed channeled ion 24 displaces a lattice atom 22a, replacing the atom in the lattice by a dopant ion 18.

An annealing process, which in the preferred embodiment raises the temperature of the doped heterostructure to 900° for 30 seconds, relieves the damage caused by the implantation process. The annealing process also activates the implanted donor ions 18, releasing carries 20 that migrate to the thin quantum well layer 14 to form a carrier gas.

Figure 2B:
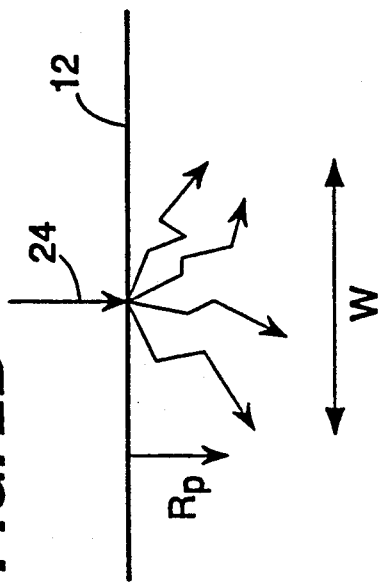
FIG. 2B shows a cutaway view of conventional ion beam implantation and beam spread.
Figure 2A:
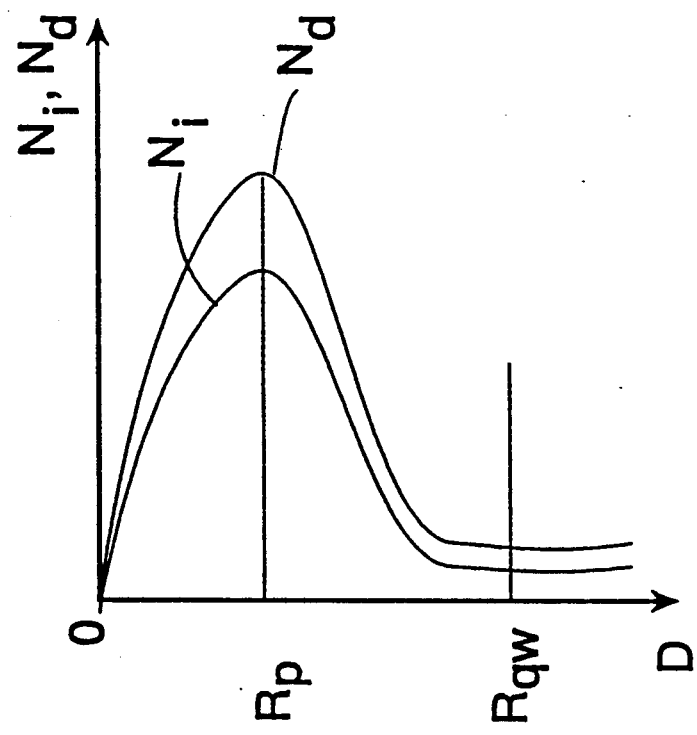
FIG. 2A shows a graph of the relationship of donor concentration and lattice damage as a function of depth.

The channeling methods of the present invention overcome problems associated with conventional ion beam implantation. FIG. 2A shows a graph as function of depth of both the number of deposited ions $N_i$ and the number of damage sites $N_d$. As is well known, these two values follow generally the same function of depth, and peak at the projected ion range $R_p$. FIG. 2B shows conventional, unchaneled incident ions 24 striking surface 12 and diffusing widely through the surface due to inelastic scattering. The broadening of the ion beam W and the consequent damage to the semiconductor layer 12 are shown again as being maximum at a depth of $R_p$. Ion channeling, as described by the present invention, minimizes ion beam broadening due to ion straggling. Ion channeling also reduces the amount of damage due to the incident ion beam.

One difficulty in using channeled ions is that the process of energy loss, being elastic, creates a statistical spread in the deposited dopant ions. To more precisely locate the dopant deposition layer within the semiconductor heterostructure, the present invention also includes a dechanneling layer. FIGS. 3A and 3B show fabrication steps including a dechanneling layer. FIG. 3A shows the same heterostructure as shown in FIG. 1A, but with a dechanneling layer (or pseudo-morphic strain layer) 28 added within the upper donor implantation layer 12b. In the preferred embodiment, the dechanneling layer is composed of $In_{0.3}Ga_{0.7}As$, two monolayers thick (approximately 5.8 Å), and located 50 nm above the quantum well layer 14. In growing the dechanneling layer, the growth temperatures was lowered to 420° C. Again, a focused ion beam 16 implants donor ions 18 as shown in FIG. 3B, but the addition of the dechanneling layer 28 causes most of the implanted donor ions 18 to come to rest near the dechanneling layer 28.

Figure 3C:
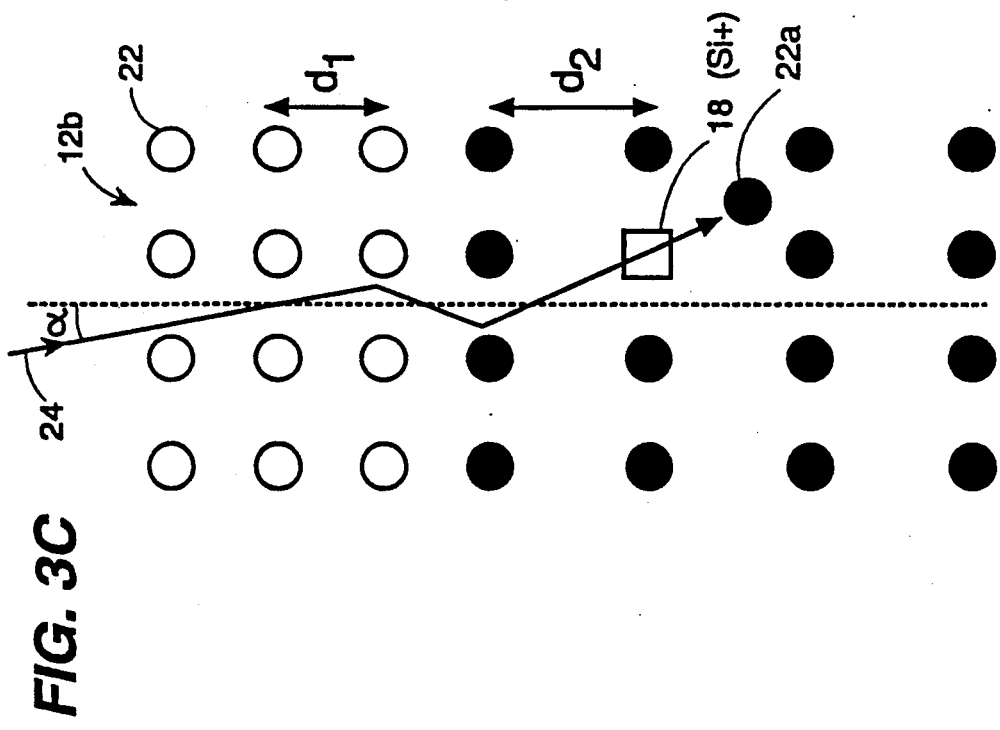
FIG. 3C shows a schematic diagram of a semiconductor lattice having different lattice constants (shaded spheres) and the path of a channeled and then dechanneled donor ion.
Figure 3A:
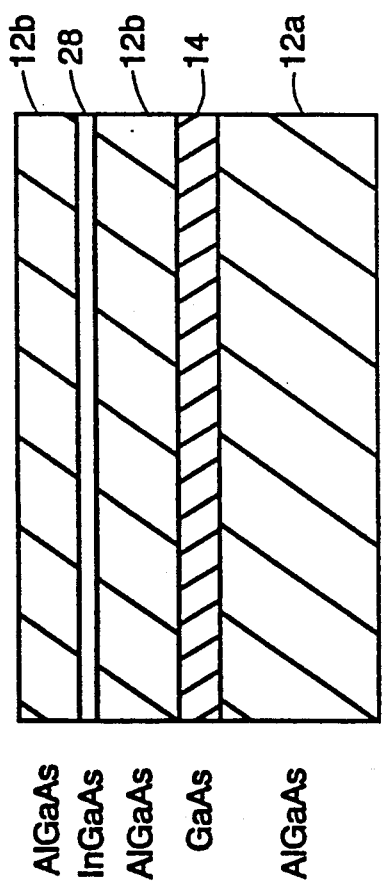
FIG. 3A shows a cutaway view of a semiconductor heterostructure having a quantum well layer and a dechanneling layer.
Figure 3B:
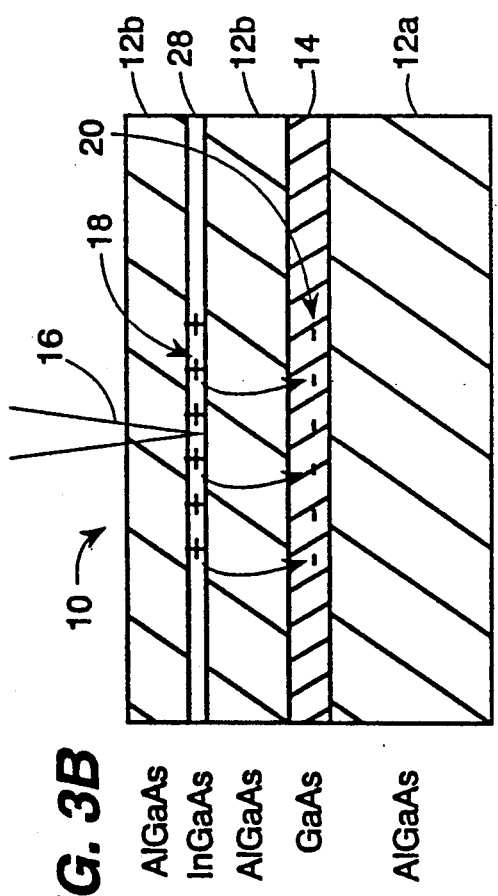
FIG. 3B shows a cutaway view of a semiconductor heterostructure with implanted donor ions at the dechanneling layer in accordance with the present invention.

The action of the dechanneling layer upon the channeled ion beam is shown in FIG. 3C. The dechanneling layer has a lattice spacing constant $d_2$ different (preferably larger) than the constant $d_1$ of the donor implantation layer. As can be seen in Equation (1), the larger spacing constant decreases the acceptable channeling angle $\alpha$. The dechanneling layer comprising elements with an atomic number largely different from that of host lattice is also preferred. In effect, ions capable of channeling through the principle donor implantation layer 12b are no longer able to channel through the dechanneling layer 28 and are rapidly dechanneled. The dechanneled ions displace a lattice atom 22a, inserting themselves into the lattice as an implanted donor ion 18. By combining the effects of channeling and then rapidly dechanneling donor ions, the present invention allows fabrication of modulation doped devices that separate any damage regions near the surface of the heterostructure from the deposited donor layer. The relatively low-energy displacement of lattice atoms by the donor ions causes lattice damage that is easily annealed out. Thus, the carriers released by the deposited donor ions are not attracted by any nearby damage sites. Instead, the carriers are efficiently attracted to the quantum well layer for use in the fabricated devices.

Figure 4:
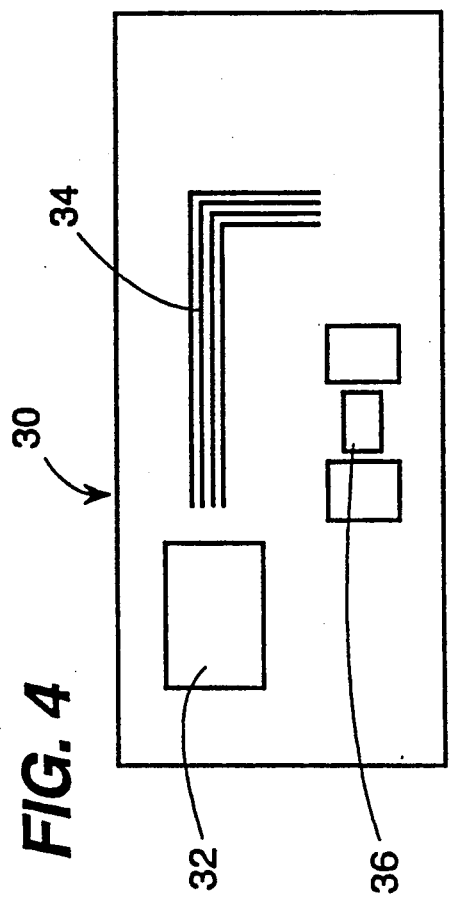
FIG. 4 shows a schematic top view of a semiconductor substrate having a variety of electrical devices integrated together.

By using a focused ion beam, and by channeling and dechanneling the incident ions, the present invention allows not only precise location of donor ions away from induced damage sites, but also forms localized regions of donors across the heterostructure surface. As shown in FIG. 4, the methods of the present invention allow for differential doping across the surface of a semiconductor wafer 30. As seen schematically, a semiconductor laser 32, conductive channel wires 34 and a MODFET 36 can all be formed on the same wafer using the same basic processes. Various dopant elements can be employed across the surface. For example, beryllium atoms can be used alongside silicon (to provide complementary n-type and p-type dopants), especially since their thermal activation temperatures are comparable. Current techniques for growing modulation doped structures cannot form these differentially doped regions, since an epitaxially grown modulation doped layer would cover the entire surface of the wafer, and since photolithographic masks would irremediably contaminate the growth surface.

Figure 5A:
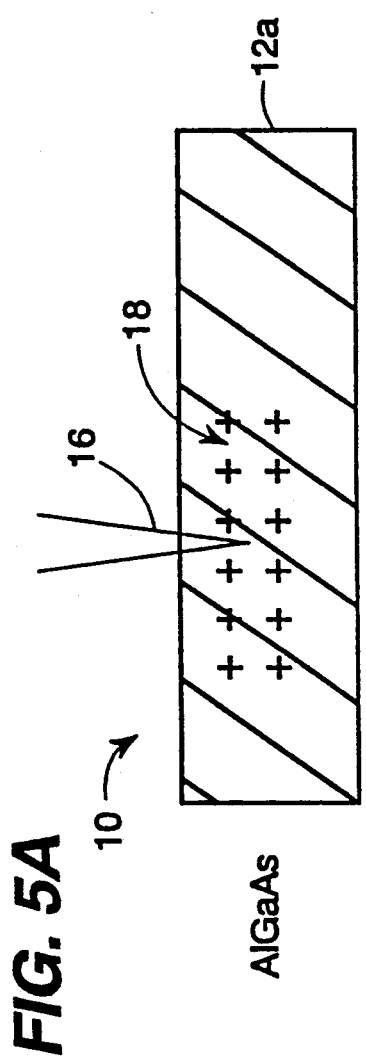
FIG. 5A shows a donor implantation layer, ion beam and implanted donors in accordance with the present invention.
Figure 5B:
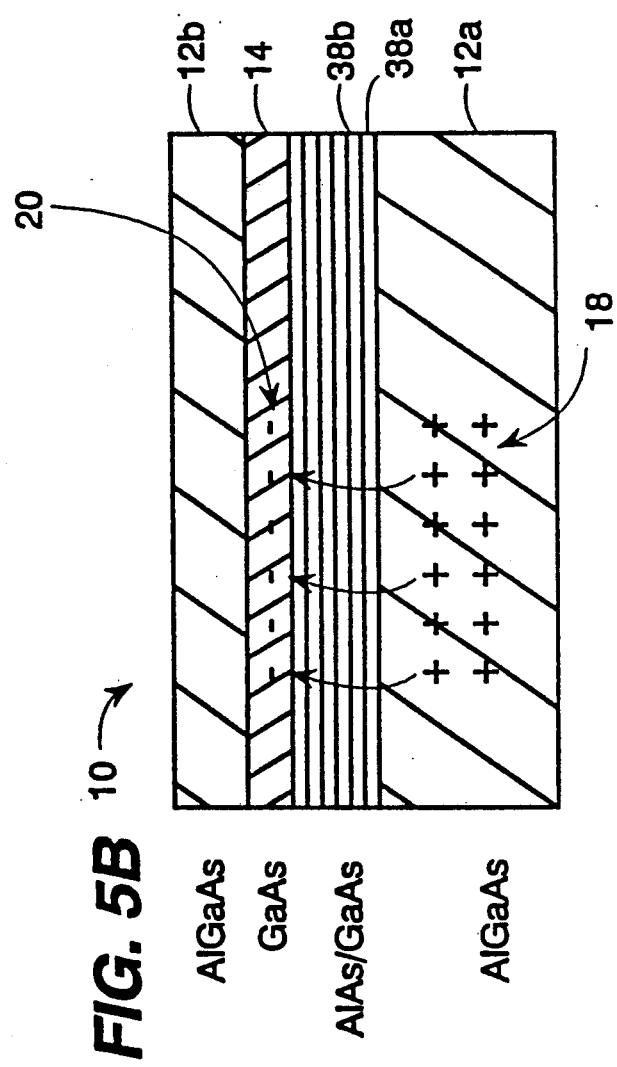
FIG. 5B shows a semiconductor heterostructure including a donor implantation layer, implanted donors, spacer layers and a quantum well layer.

The methods of the present invention can also be employed for a variety of other semiconductor structures. A variant of modulation doped heterostructures is shown in FIGS. 5A and 5B. In this alternative embodiment, one begins with an AlGaAs donor implantation layer substrate 12a. A focused ion beam 16 "writes" areas of implanted donor ions 18 below the donor implantation layer surface. Annealing minimizes damage from the channeled beam. A series of alternating AlAs and GaAs spacer layers 38a and 38b, each 10 Å thick, are regrown by molecular beam epitaxy. This method requires a conventional in situ ultra-high vacuum focused ion beam - molecular beam epitaxy processing. The spacer layers provide a buffer between the modulation doped region, and the later epitaxially grown quantum well region 14 and the final AlGaAs wide band-gap region 12b. During a second thermal annealing step, the implanted donor ions 18 are activated, releasing a carrier gas 20 into the quantum well region 14. The alternating barriers of the spacer layers 38a and 38b prevent migration of the imbedded donor ions 18. The spacer layers can also be employed in the first embodiment of the invention as well to prevent such migration.

Figure 6A:
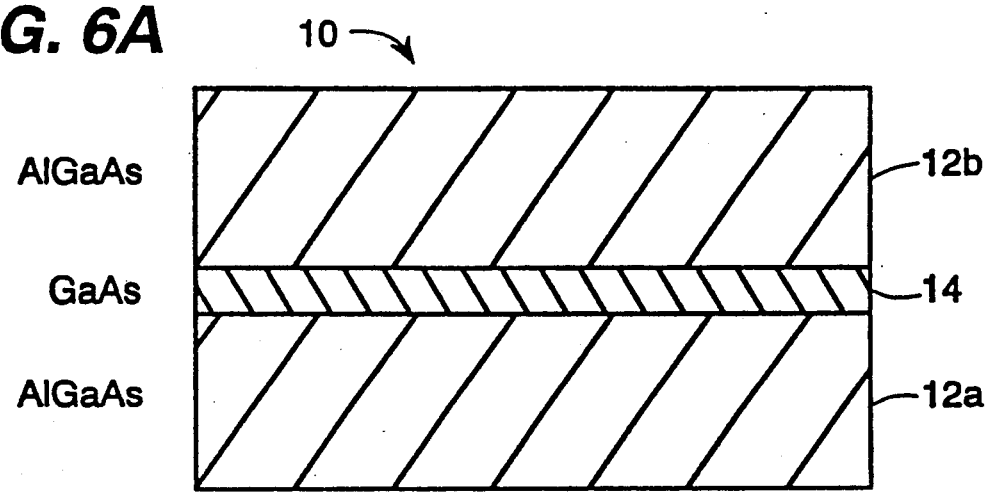
FIG. 6A shows a semiconductor heterostructure including a quantum well layer.
Figure 6B:
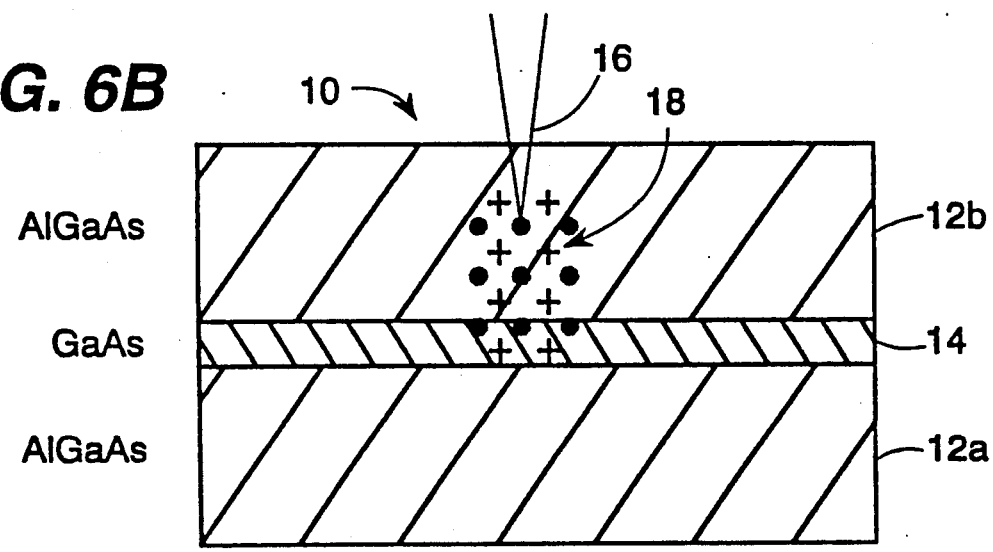
FIG. 6B shows an ion beam implanting donor ions that also introduces point defects.
Figure 6C:
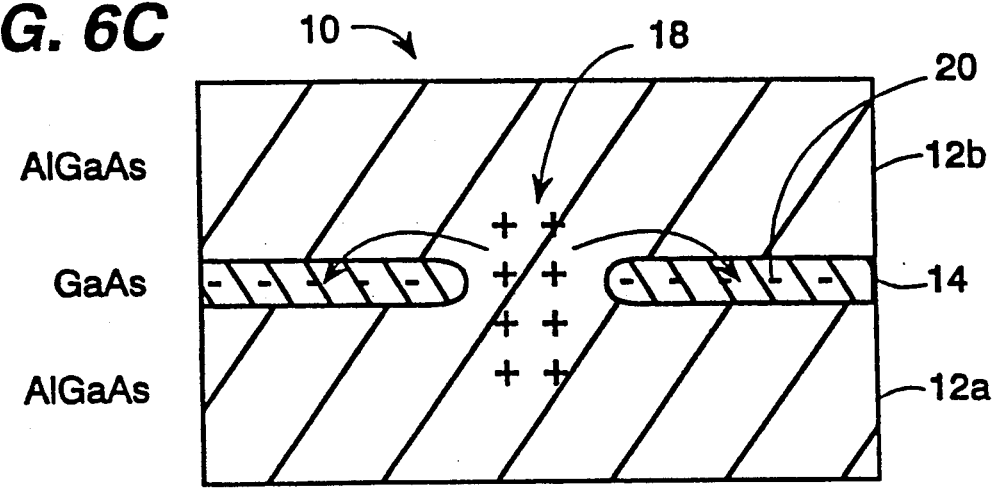
FIG. 6C shows wide band-gap areas interdiffused with the quantum well layer.

In another embodiment, the focused ion beam 16 is used to imbed concentrations of silicon (or other dopant atoms) at certain points in the heterostructure 10. This method is illustrated in FIGS. 61 through 6C. The method begins with the double heterostructure shown in FIG. 6A, comprising a sandwich of AlGaAs 12a, GaAs 14 and AlGaAs 12b, as before. As shown in FIG. 6B, a focused ion beam 16 implants a localized concentration of dopant ions 18, here of silicon, even partially through the quantum well layer 14. The silicon ions perform two functions during the thermal annealing phase. First, being point defects, the silicon ions cause interdiffusion between the wide and narrow band-gap layers. Aluminum atoms migrate through the area, breaking the quantum well layer 14 into distinct regions. Second, one the quantum well regions have separated, the silicon ions donate carries 20 into the quantum well regions. In the single implantation step, separate quantum well regions are formed and then filled with carrier gases.

Figure 7A:
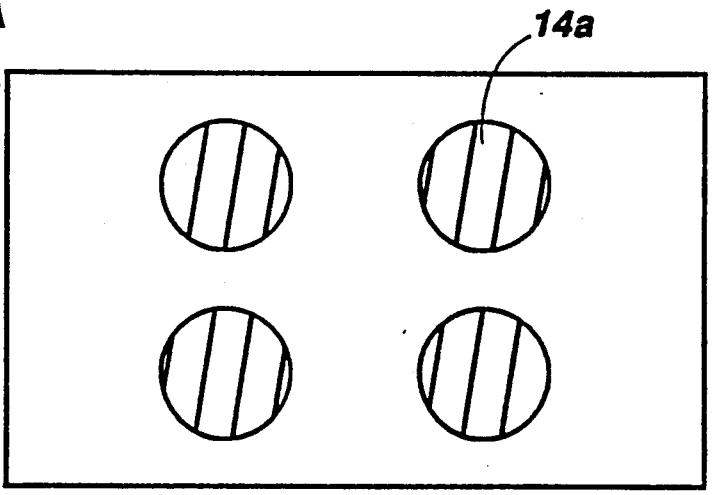
FIGS. 7A, 7B and 7C show top view diagrams of various configurations of quantum well areas, including, respectively, quantum dots (zero dimensional electron gas), and antidot lattice, and electron ring lattice.
Figure 7B:
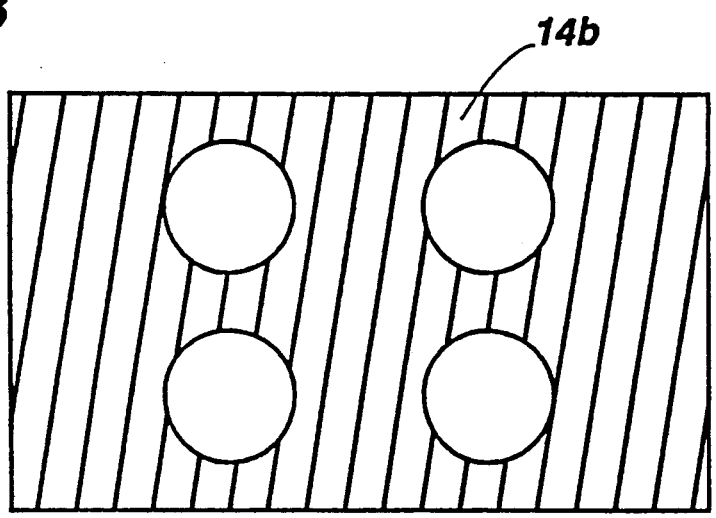
Figure 7C:
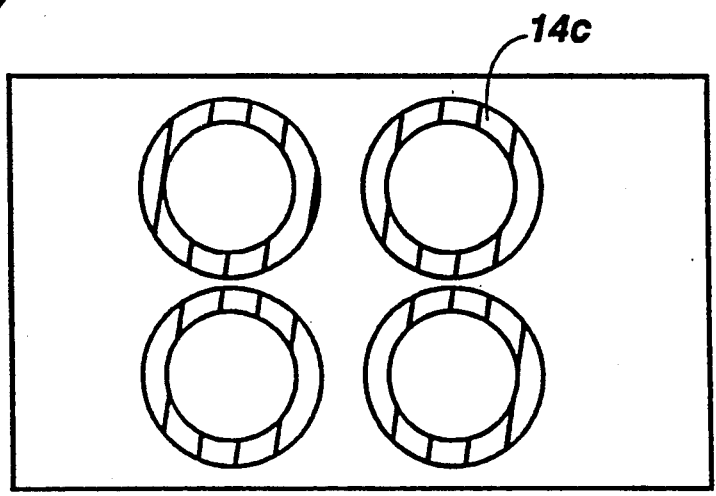
Figure 8A:
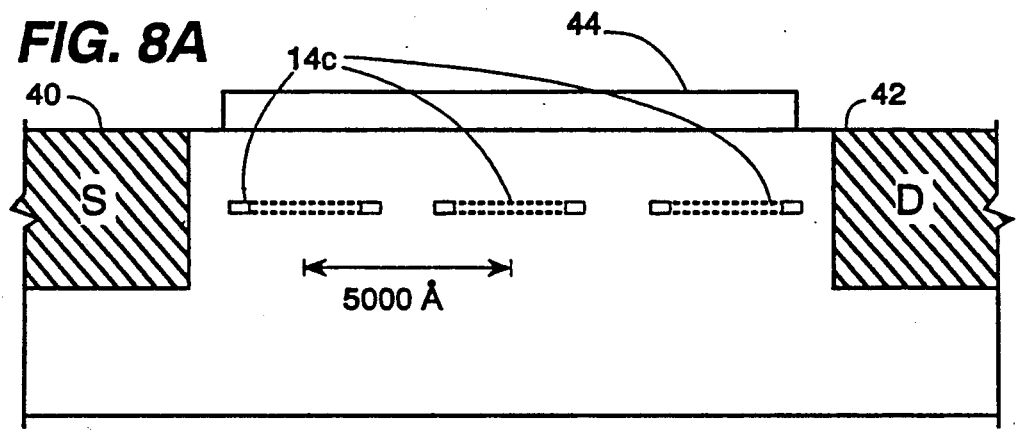
FIG. 8A shows a cutaway view of a MODFET transistor including quantum well electron rings.
Figure 8B:
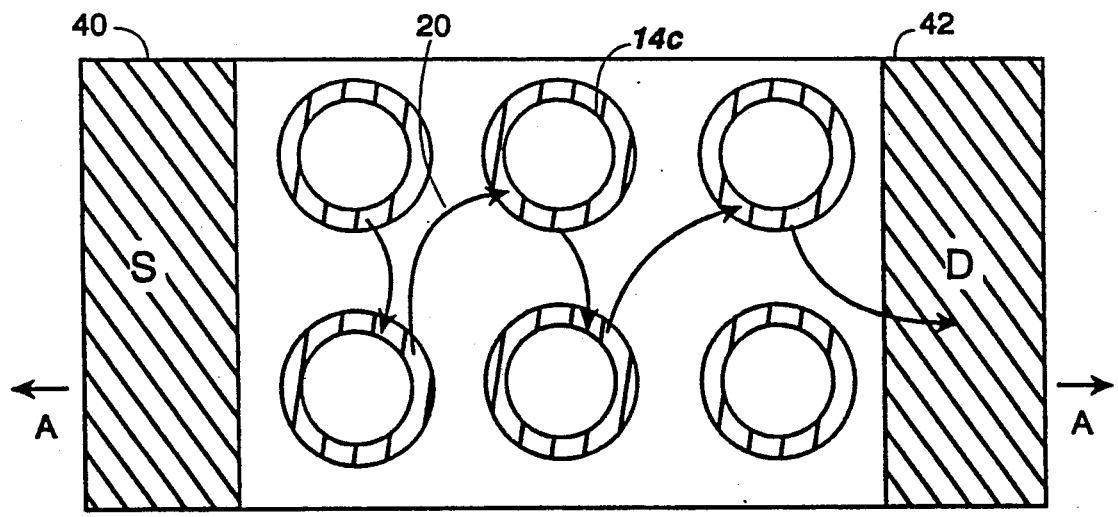
FIG. 8B shows electron carrier transfer in an array of electron rings.

The alternative interdiffusion method enables the writing of a variety of distinct quantum well features within a semiconductor substrate. Three possible examples are shown in FIGS. 7A through 7C. FIG. 7A shows electron dots 14a, comprising separated round quantum well regions surrounded by areas where Si ions had been implanted, and interdiffusion had occurred. The inverse of FIG. 7A is shown in FIG. 7B, where round dot regions had been implanted, forming a quantum well sheet 14b perforated by interdiffusion (and carrier donor) regions. FIG. 7C shows a third possibility, electron rings 14c surrounded without and within by interdiffused regions. Because of the high mobility of the carriers in the quantum well regions, perpetual currents can be induced in the electron rings. A series of such rings (or of any other quantum well topology) can be employed within the gate region between source and drain electrodes in a Modulated Doped FET (or MODFET) 50, as shown in FIG. 8A. The MODFET can include a source region 40, a drain region 42 and a gate electrode 44. The gate electrode is located over a series of electron ring depositions 14c. As shown in FIG. 8B, electron carriers 20 jump from ring to ring 14c (or dot to dot) dependent on the induced voltage of the gate electrode. The same principle can be used wherever a channel region for transfer of charge is used in semiconductor devices. The different quantum well topologies provide high-speed, flexible and relatively easily manufactured channels for charge flow. One advantage of the interdiffusion technique is that instead of scrupulously avoiding any interdiffusion of the silicon donors, the donor implantation layer or the quantum well, the method actually exploits interdiffusion.

While the present invention has been described with reference to preferred embodiment, those skilled in the art will recognize that various modifications may be provided. For example, any of the various semiconductor material families, such as II-VI materials, III-V materials and the silicon and germanium families can be substituted to provide the appropriate heterostructures and dopant materials. As epitaxial layers are grown and then implanted with donors, several quantum well regions can be stacked, separated by donor implantation layers. An innumerable number of devices can be constructed from the same basic methods, as should be obvious to those skilled in the art. Various thicknesses, temperatures, concentrations and topologies can also be adjusted and adapted to suit required end uses. The spacer layers and dechanneling layers can be used in various combinations to achieve the desire concentration of donor ions at specific locations. These and other variations upon and modifications to the described embodiments are provided for by the present invention, the scope of which is limited only by the following claims.

What is claimed is:

1. A method of fabricating a modulation doped structure comprising the steps of:

forming a quantum well layer;

forming a donor implantation layer above said quantum well layer; and depositing an amount of dopant atoms within said donor implantation layer; substantially all of said deposited dopant atoms being located at a distance from said quantum well layer.

2. The method as recited in claim 1 further comprising:

thermally annealing said modulation doped structure.

3. The method as recited in claim 1 wherein said depositing of said dopant atoms comprises ion implantation.

4. The method as recited in claim 1 wherein said dopant atoms are deposited in bounded areas across said donor implantation layer.

5. The method as recited in claim 3 wherein said ion implantation step channels said dopant atoms substantially along the lattice of said donor implantation layer.

6. The method as recited in claim 3 wherein said ion implantation step employs a focused ion beam having a focus angle less than or equal to a channeling half-angle $\alpha$ of said donor implantation layer.

7. The method as recited in claim 1 wherein said quantum well layer is formed substantially from gallium arsenide and wherein said donor implantation layer is formed substantially from aluminum gallium arsenide.

8. A method of fabricating a modulation doped structure comprising the steps of:

forming a quantum well layer;

forming a donor implantation layer above said quantum well layer, said donor implantation layer including a dechanneling layer; and depositing an amount of dopant atoms within said donor implantation layer; substantially all of said deposited dopant atoms being located at a distance from said quantum well layer.

9. The method as recited in claim 8 further comprising:

thermally annealing said modulation doped structure.

10. The method as recited in claim 8 wherein said depositing of said dopant atoms comprises ion implantation.

11. The method as recited in claim 10 wherein said ion implantation step channels said dopant atoms substantially along the lattice of said donor implantation layer.

12. The method as recited in claim 10 wherein said ion implantation step employs a focused beam having a focus angle less than or equal to a channeling half-angle $\alpha$ of said donor implantation layer.

13. The method as recited in claim 8 wherein said quantum well layer is formed substantially from gallium arsenide and wherein said donor implantation layer is formed substantially from aluminum gallium arsenide.

14. A method of fabricating a modulation doped structure comprising the steps of:

forming a donor implantation layer;

depositing an amount of dopant atoms within said donor implantation layer; substantially all of said deposited dopant atoms being located at a distance from the upper surface of said donor implantation layer; and forming a quantum well layer above said donor implant layer.

15. The method as recited in claim 14 further comprising:

thermally annealing said modulation doped structure.

16. The method as recited in claim 14 wherein said depositing of said dopant atoms comprises ion implantation.

17. The method as recited in claim 16 wherein said ion implantation step channels said dopant atoms substantially along the lattice of said donor implantation layer.

18. The method as recited in claim 16 wherein said ion implantation step employs a focused ion beam having a focus angle less than or equal to a channeling half-angle $\alpha$ of said donor implantation layer.

19. The method as recited in claim 14 wherein said quantum well layer is formed substantially from gallium arsenide and wherein said donor implantation layer is formed substantially from aluminum gallium arsenide.

20. A method of fabricating a modulation doped structure comprising;

forming a first inversion layer;

forming a quantum well layer, said quantum well layer disposed above said first inversion layer;

forming a second inversion layer, said second inversion layer disposed above said quantum well layer;

implanting ions at a location with said second inversion layer; and annealing said modulation doped structure such that said second inversion layer interdiffuses through said quantum well layer at substantially the location of said implantation.

21. The method as recited in claim 20 wherein said depositing of said dopant atoms comprises ion implantation.

22. The method as recited in claim 21 wherein said ion implantation step channels said dopant atoms substantially along the lattice of said second inversion layer.

23. The method as recited in claim 21 wherein aid ion implantation step employs a focused ion beam having a focus angle less than or equal to a channeling half-angle $\alpha$ of said donor implantation layer.

24. The method as recited in claim 20 wherein said quantum well layer is formed substantially from gallium arsenide and wherein aid donor implantation layer is formed substantially from aluminum gallium arsenide.

* * * * *